United States Patent [19]
Mertol

[11] Patent Number: 5,909,056
[45] Date of Patent: Jun. 1, 1999

[54] HIGH PERFORMANCE HEAT SPREADER FOR FLIP CHIP PACKAGES

[75] Inventor: Atila Mertol, Cupertino, Calif.

[73] Assignee: LSI Logic Corporation, Milpitas, Calif.

[21] Appl. No.: 08/868,316

[22] Filed: Jun. 3, 1997

[51] Int. Cl.[6] ............................. H05K 3/34; H01L 23/02
[52] U.S. Cl. .................. 257/704; 257/712; 257/717; 257/737; 257/738; 257/787; 257/707; 257/796; 257/722; 438/122; 438/121; 361/386
[58] Field of Search ..................................... 257/712, 706, 257/717, 720, 675, 737, 738, 707, 734, 710, 713, 722, 787, 796; 361/707, 714, 719; 174/16.3; 438/122, 121

[56] References Cited

U.S. PATENT DOCUMENTS

| | | | |
|---|---|---|---|
| 4,092,697 | 5/1978 | Spaight | 361/386 |
| 4,914,551 | 4/1990 | Anschel et al. | 361/389 |
| 4,987,478 | 1/1991 | Braun et al. | 257/707 |
| 5,359,768 | 11/1994 | Haley | 29/840 |
| 5,387,815 | 2/1995 | Nishiguchi | 257/713 |
| 5,510,956 | 4/1996 | Suzuki | 257/796 |
| 5,523,586 | 6/1996 | Sakurai | 257/707 |
| 5,578,525 | 11/1996 | Mizukoshi | 29/840 |
| 5,615,086 | 3/1997 | Collins et al. | 257/713 |
| 5,625,226 | 4/1997 | Kinzer | 257/707 |
| 5,699,227 | 12/1997 | Kolman et al. | 257/714 |
| 5,706,171 | 1/1998 | Edwards et al. | 257/717 |
| 5,724,230 | 3/1998 | Poetzinger | 257/713 |
| 5,724,729 | 3/1998 | Sherif et al. | 257/722 |

OTHER PUBLICATIONS

IBM Technical Disclosure Bulletin vol. 34 No. 7B Aluminum Nitride Cap Design Obviating Problems of Thermal Conductivity and TEC Associated with Polymer–Ceramic Substrate, Dec. 1991.

*Primary Examiner*—Alexander Oscar Williams

[57] ABSTRACT

According to one aspect of the invention, a semiconductor package is provided including a package substrate having an upper surface and a lower surface, wherein electrical contacts on the lower surface of the substrate are coupled to corresponding electrical contacts on a printed circuit board by a plurality of solder balls; a semiconductor die having a non-active surface and an active surface, wherein the active surface is electrically coupled to the upper surface of the package substrate by a plurality of solder bumps; and an integrated heat spreader and ring stiffener coupled with the non-active surface of the semiconductor die by a phase change material which is retained by a miniature dam ring while in a liquid state, wherein heat generated by the die is transferred to the heat spreader, and wherein the heat spreader has a protrusion formed thereon which matches the outermost size of the die.

1 Claim, 1 Drawing Sheet

HIGH PERFORMANCE HEAT SPREADER FOR FLIP CHIP PACKAGES

TECHNICAL FIELD

The present invention relates generally to semiconductor packaging technology, and more particularly, to a high performance heat spreader with enhanced thermal dissipation characteristics for use in flip chip semiconductor packages.

BACKGROUND OF THE INVENTION

The amount of heat generated by a semiconductor device, for example, a silicon chip, is related to the number of transistors deployed on the device, the amount of power passed through the transistors, and the clock speed at which the semiconductor device is operated. Thus, as the number of transistors fabricated onto a single semiconductor device increases, the amount of heat generated by the device increases. Likewise, as the amount of power passed through the transistors increases, or as the speed at which the clock operating the semiconductor device increases, the amount of heat generated by the device also increases.

Since advances in semiconductor fabrication technology continue to yield ever more densely packaged high power transistors which are operated at faster and faster clock speeds, the problems associated with semiconductor device heat generation and dissipation are becoming more acute. In performance-driven applications, the highest clock speed options are generally preferred. However, since the highest clock speed options require more power and create more heat in a device, the difficulties associated with thermal buildup and dissipation are particularly prevalent.

One major problem associated with high power semiconductor devices is that as an increasing amount of heat is generated, the junction temperature of the transistors on the device increases proportionately. Those of skill in the art will appreciate that the failure rate of a semiconductor device is directly related to the junction temperature at which the device is operated. In other words, the higher the junction temperature, the greater the likelihood the device will fail. Accordingly, it is desirable to fabricate semiconductor devices in various package configurations which better facilitate heat transfer, and thus extend the life and reduce the failure rate of the devices.

In describing how generated heat is removed from a high power semiconductor device, it is convenient to consider the problem in two parts. First, there is a case-to-ambient thermal dissipation path, frequently called the external thermal path. The case-to-ambient path is dominated by a mechanism for transferring generated heat from the device directly out into the ambient environment.

Next, there is a junction-to-case thermal dissipation path, often called the internal thermal path. The junction-to-case path typically has a region directly in contact with the die in which heat flows predominantly in a vertical direction, i.e., in a direction normal to the active surface of the die, and then a region with a heat spreader in which lateral heat flow dominates. A heat spreader is any thick, thermally conductive plate used for laterally transferring heat on the package surface and for convectively removing heat away from an electrical device. Since the heat spreader diffuses heat laterally, the area through which heat can flow from the die to the ambient environment is effectively increased.

One problem with a conventional heat spreader is that the interface material used to attach the heat spreader to the back of the device creates additional thermal resistance in the heat transfer path between the die and the heat spreader. For example, a thick layer of epoxy is frequently used to attach the non-active surface of a semiconductor die to the bottom surface of a heat spreader. However, since epoxy has a very low thermal conductivity, it creates a large resistance for heat flow. Therefore, thermal dissipation capabilities for the package are reduced. Conversely, if the thermal resistance between the device surface and the heat spreader is reduced, the thermal performance of the package is improved due to the low resistance of the heat path.

Since high thermal resistance in the interface between a semiconductor die and a heat spreader can have a negative impact on both the performance and lifespan of a semiconductor package, it is therefore an object of the present invention to provide a high performance heat spreader which overcomes the above-mentioned difficulties by reducing thermal resistance and improving heat transfer processes. It is a further object of the invention to provide a heat spreader having a protrusion on the lower surface thereof which matches the size of a semiconductor die to which it is interfaced in such a manner that thermal resistance in the interface is reduced and better heat transfer characteristics are realized. Still further objects and advantages of the present invention will become apparent in view of the following disclosure.

SUMMARY OF THE INVENTION

To achieve the objects of the present invention, there is provided, according to one embodiment of the present invention, a semiconductor package comprising a package substrate having an upper surface and a lower surface, the lower surface of the substrate having electrical contacts attachable to corresponding electrical contacts on a printed circuit board; a semiconductor die having a non-active surface and an active surface, wherein the active surface is electrically coupled to the upper surface of the package substrate; and a heat spreader which couples with the non-active surface of the semiconductor die such that heat generated by the die is transferred to the heat spreader, wherein the heat spreader has a protrusion formed thereon which matches the outermost dimensions of the die.

According to another embodiment of the invention, there is provided a heat spreader useful with a semiconductor package which includes a package substrate having an upper surface and a lower surface, the lower surface having electrical contacts for coupling by a plurality of solder balls to corresponding electrical contacts on a printed circuit board, and a semiconductor die which is electrically coupled to the upper surface of the package substrate, wherein the heat spreader comprises a lower surface having a protrusion for coupling with the semiconductor die and an upper surface for convectively removing heat generated by the semiconductor die, and wherein the protrusion on the lower surface of the heat spreader matches the outermost dimensions of the die.

DETAILED DESCRIPTION OF EMBODIMENTS OF THE INVENTION

Figure 1A:
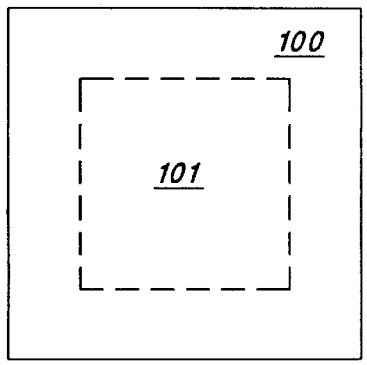
FIG. 1A is a top view of a high performance heat spreader according to an embodiment of the present invention.
Figure 1B:
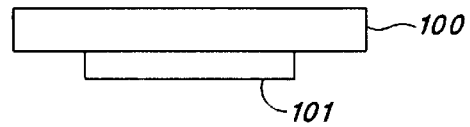
FIG. 1B is a side view of a high performance heat spreader according to an embodiment of the present invention.
Figure 2:
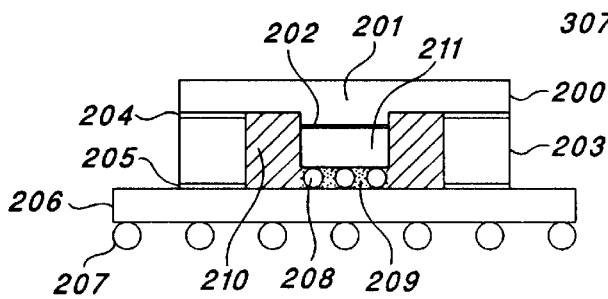
FIG. 2 is a cross-sectional view of a high performance heat spreader attached to the back of a semiconductor device by pressure contact according to an embodiment of the present invention.

A heat spreader equipped with advantages of the present invention is depicted in FIGS. 1A and 1B. As shown, heat spreader 100 has a protrusion 101 formed on its bottom surface, i.e., the side of the heat spreader which is to be attached to the back, or non-active surface, of a semiconductor die. As seen in FIG. 2, the outermost dimensions of the protrusion 201 on the bottom of the heat spreader 200 match the outermost dimensions of the semiconductor die 211 to which it is attached. Since the protrusion 201 extends down far enough toward the package substrate 206 to substantially engage the non-active surface of semiconductor die 211, a "metal-to-metal" seal 202 is formed in which the bottom surface of the protrusion 201 directly contacts the back or non-active surface of the die 211. The metal-to-metal connection is maintained through a slight mechanical pressure exerted by the heat spreader 200. Thus, while there is no epoxy or other interface material between the die 211 back surface and the protrusion 201, heat transfer from the die 211 to the heat spreader 200 is maintained through contact between the die 211 and the protrusion 201.

The active surface of die 211 is provided with a plurality of solder bumps 208 formed on bond pads on its active surface. The solder bumps 208 provide electrical coupling between the bond pads on the die 211 and electrical contacts located on the upper surface of package substrate 206. This is referred to as a "flip-chip" package. The area beneath die 211 is covered for protection by an underfill epoxy 209 which serves as an encapsulant for the sensitive electrical connections. In practical applications, the package is attached to a printed circuit board (not shown) using, for example, a plurality of solder balls 207 to provide electrical connection. Similarly, a conventional heat spreader could be attached to other kinds of packages, such as a ball grid array, pin grid array, etc.

Package substrate 206 may be fashioned from a variety of materials known to those of skill in the art, for example, from molded plastic with multiple shelves bonded together. When the substrate is formed from a plastic material, the package is often referred to as a plastic flip chip ball grid array.

Alternatively, the substrate may comprise a thick-film or cofired ceramic material, again having electrical traces for coupling via solder bumps 208 with semiconductor die 206. If the substrate is formed of a ceramic material, the package is referred to as a ceramic package. Other packaging techniques are also useful with embodiments of the present invention, for example, tape automated bonding ("TAB"), pin grid array packaging, etc.

In one embodiment, after semiconductor die 211 is electrically coupled to the top of the package substrate 206, a dam ring or stiffener ring 203 is attached to the top surface of the substrate 206 by, for example, a dam ring or stiffener ring attachment epoxy 205. The gaps created between the coupled semiconductor device 211 and the dam ring 203 are filled with an epoxy 209/210 having a high thermal conductivity. Another epoxy 204, which may be of the same type used between the device 211 and the dam ring 203, is dispensed on the top surface of the dam ring 203. Finally, a heat spreader 200 having a protrusion 201 as discussed above is clamped to the package during curing. Since there is no epoxy or other interface material between the metal-to metal seal 202, an interface with a low thermal resistance is created between the die 211 and the protrusion 201 on the heat spreader 200. Since thermal resistance in the interface is reduced, heat generated by the die 211 is better transferred to the heat spreader 200 for dissipation. The improved heat transfer process improves the life expectancy of the package and reduces the chance that semiconductor device 211 will fail.

Figure 3:
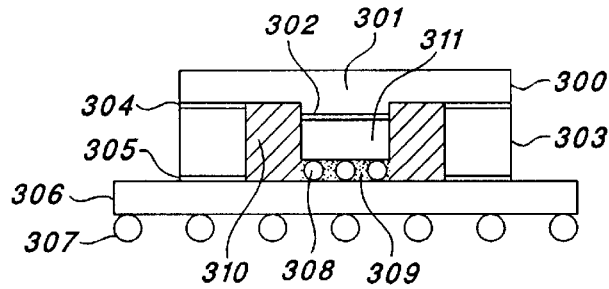
FIG. 3 is a cross-sectional view of a high performance heat spreader attached to the back surface of a semiconductor device using an epoxy or tape attachment material according to an embodiment of the present invention.

Referring now to FIG. 3, another embodiment of the invention is shown which includes a heat spreader 300 having a protrusion 301 formed on its bottom surface. Having the protrusion 301 on the heat spreader 300 results in the heat spreader effectively being placed closer to the semiconductor die 311. As discussed above, the closer heat spreader 300 can be placed to the semiconductor die 311, the less thermal resistance is created by the interface between them, and heat transfer processes flowing from the die to the heat spreader are improved. However, due to the different thermal expansion coefficients of the semiconductor device and the heat spreader material, the metal-to-metal seal of the above embodiment may in some cases be lost during heating. Thus, the present invention also provides for an interface 302 between the protrusion 301 and the semiconductor die 311 which comprises a thin layer of epoxy, e.g., for example, such as "LOCTITE-384", available from Loctite Corp., for providing and maintaining permanent contact between the protrusion 301 and the semiconductor die 311 during heating and cooling of the device. Alternatively, a thermally conductive tape, for example, such as "T-Flex" 440, available from Thermagon, Inc., may be substituted in place of the thin layer of epoxy. While the thermal conductivity of both epoxy and tape is relatively low and therefore creates an additional undesirable thermal resistance in the interface 302, the additional resistance is still much lower than with conventional heat spreaders 300 because the layer of epoxy or tape is very thin due to the extension of the protrusion 301 toward the non-active surface of the semiconductor die 311. Put another way, with conventional heat spreaders, the layer of interface material is very thick because there is no protrusion extending from the bottom surface of the heat spreader toward the back surface of the die and thus the thermal resistance in the heat transfer path is much greater than in the present invention.

Figure 4A:
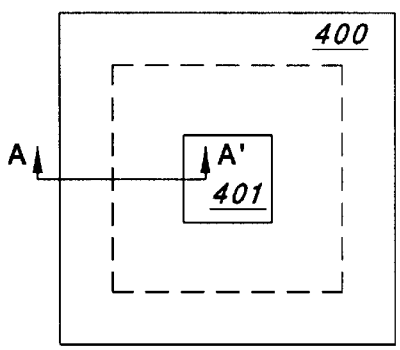
FIG. 4A is a top view of a miniature dam ring device for use with a high performance heat spreader according to an embodiment of the present invention.
Figure 4B:
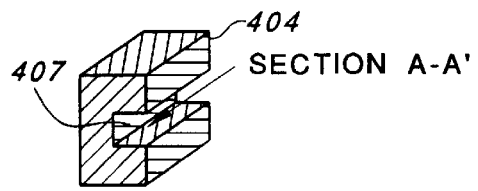
FIG. 4B is a sectional view of a miniature dam ring device for use with a high performance heat spreader according to an embodiment of the present invention.
Figure 4C:
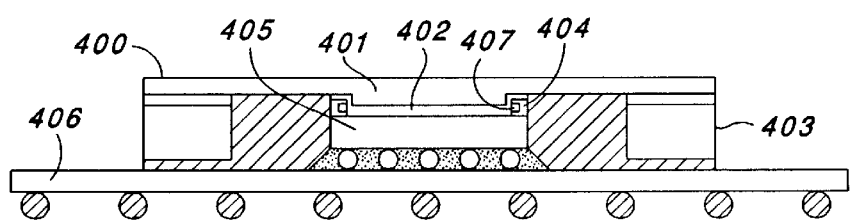
FIG. 4C is a cross-sectional view of a high performance heat spreader with a miniature dam ring device attached to the back of a semiconductor device by a phase change interface material according to an embodiment of the present invention.

Referring now to FIG. 4C, there is shown a still further embodiment of the invention including a heat spreader 400 having a protrusion 401 which extends downward, i.e., toward the package substrate 406, such that the bottom surface of the protrusion 401 is in close proximity to the non-active surface of die 405. In this embodiment, the interface 402 between the protrusion 401 and the back of the die 405 is achieved by a bond effected by use of a high thermal conductivity phase change material, for example, such as T-Pli 205-A0, also available from Thermagon, Inc., which is solid while the package is cool but liquifies as the package heats up to form an interface 402 which securely bonds the die 405 and the protrusion 401 together.

Since the phase change interface material 402 liquifies when heated, the package must be adapted to allow for the difference in volume of the phase change material caused by its expansion and contraction as it changes between liquid and solid states. Therefore, one embodiment of the invention provides a miniature dam ring 404 with a reservoir capability which is attached to the non-active surface of the die 405. Those of skill in the art will appreciate that miniature dam ring 404, used to prevent phase change interface material 402 from spilling into the package when in a liquid state, is discrete from dam ring 403, which is used to keep filling epoxy surrounding the die 405 from spilling out of the package.

An isolated view of a portion of the miniature dam ring 404 is depicted in FIG. 4B. As shown, miniature dam ring 404 has a channel 407 formed therein. The channel 407 faces toward the die 405 as shown in FIG. 4C. When the phase change material 402 placed between die 405 and protrusion 401 melts, the melted interface material 402 fills channel 407 of dam ring 404 rather than spill out of the interface and into the package. During cooling processes, the phase change material shrinks and solidifies.

Figure 5:
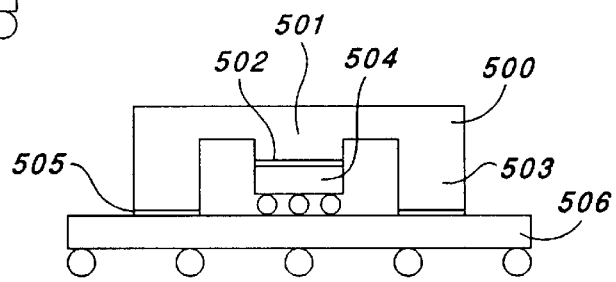
FIG. 5 is a cross-sectional view of a high performance integrated heat spreader and ring stiffener attached to the back of a semiconductor device according to an embodiment of the present invention.

Referring now to FIG. 5, a still further embodiment of a semiconductor package equipped with advantages of the present invention is depicted. Again, the lower surface of heat spreader 500 has a protrusion 501 formed thereon which extends downward, i.e., toward the upper surface of the package substrate 506, such that the lower surface of protrusion 501 is in close proximity to the non-active surface of the semiconductor die 504. The lower surface of the heat spreader 500, however, is also formed structurally integral with a ring stiffener 503 such that a lower surface of the ring stiffener 503 is attached to an upper surface of the package substrate 506 by a stiffener ring attach material 505, for example, an epoxy. Since the heat spreader 500 and ring stiffener 503 are now integrated into one piece, the time and expense of attaching an upper surface of the ring stiffener 503 to a lower surface of the heat spreader 500 using an attach material is avoided.

As discussed with respect to the embodiments described above, the interface 502 between the lower surface of protrusion 501 and the non-active surface of semiconductor die 504 may be achieved by either a metal-to-metal seal created by direct contact between the protrusion 501 and the die 504, or by adhering the protrusion 501 and the die 504 together using one of a tape, epoxy or phase change material.

It will occur to those of skill in the art that further embodiments and advantages of the present invention may be realized without departing from the scope or spirit thereof, and the embodiments recited above should not be considered as limitative.

I claim:

1. A method of making a semiconductor package, said method comprising the following steps:

(a) providing a package substrate having an upper surface and a lower surface, the lower surface of the substrate having electrical contacts attachable to corresponding electrical contacts on a printed circuit board;

(b) electrically coupling an active surface of a semiconductor die to the upper surface of the package substrate, the semiconductor die having a non-active surface;

(c) coupling a protrusion formed on a bottom surface of a heat spreader to the non-active surface of the semiconductor die using a phase change material such that the heat generated by the die is transferred to the heat spreader via the phase change material; and (d) providing a miniature dam ring attached to the non-active surface of the semiconductor die to retain the phase change material while in a liquid state.

* * * * *